US008450910B2

(12) United States Patent
Gelly et al.

(10) Patent No.: US 8,450,910 B2
(45) Date of Patent: May 28, 2013

(54) ULTRASOUND TRANSDUCER ELEMENT AND METHOD FOR PROVIDING AN ULTRASOUND TRANSDUCER ELEMENT

(75) Inventors: Jean-Francois Gelly, Sophia-Antipolis (FR); Anne Cecile Dagonneau, Sophia-Antipolis (FR); Jean Pierre Malacrida, Sophia-Antipolis (FR)

(73) Assignee: General Electric Company, Schenectady, NY (US)

(*) Notice: Subject to any disclaimer, the term of this patent is extended or adjusted under 35 U.S.C. 154(b) by 78 days.

(21) Appl. No.: 13/007,214

(22) Filed: Jan. 14, 2011

(65) Prior Publication Data

US 2012/0181902 A1 Jul. 19, 2012

(51) Int. Cl.
*H01L 41/053* (2006.01)

(52) U.S. Cl.
USPC ............................ 310/346; 310/340; 310/345

(58) Field of Classification Search
USPC .......................................... 310/346, 340, 345
See application file for complete search history.

(56) References Cited

U.S. PATENT DOCUMENTS 5,044,370 A 9/1991 Dubut et al.
7,105,986 B2 * 9/2006 Wildes et al. ................. 310/327
7,621,028 B2 11/2009 Gelly et al.
7,755,255 B2 * 7/2010 Saito et al. .................... 310/334
7,777,398 B2 * 8/2010 Takei et al. ................... 310/365
2004/0002655 A1 * 1/2004 Bolorforosh et al. ......... 600/459
2004/0004906 A1 1/2004 Vernet et al.
2006/0030780 A1 2/2006 Gelly et al.
2006/0043839 A1 * 3/2006 Wildes et al. ................. 310/327
2006/0261707 A1 * 11/2006 Wildes et al. ................. 310/346
2008/0000770 A1 * 1/2008 White ...................... 204/298.12
2009/0034370 A1 * 2/2009 Guo ............................. 367/180
2009/0072668 A1 3/2009 Gelly et al.
2009/0099446 A1 4/2009 Frigstad et al.
2010/0237746 A1 9/2010 Calisti et al.
2010/0240998 A1 9/2010 Calisti et al.
2010/0305448 A1 12/2010 Dagonneau et al.
2010/0317972 A1 12/2010 Baumgartner et al.

* cited by examiner

*Primary Examiner* — Jaydi San Martin
*Assistant Examiner* — Bryan Gordon
(74) *Attorney, Agent, or Firm* — The Small Patent Law Group; Dean D. Small

(57) ABSTRACT

An ultrasound transducer element includes a piezoelectric layer, a front end body, and a backing layer assembly. The piezoelectric layer extends between opposite front and back sides and is configured to transmit acoustic waves from the front side. The front end is body disposed proximate to the front side of the piezoelectric layer and is configured to emit the acoustic waves out of a housing. The backing layer assembly is disposed proximate to the back side of the piezoelectric layer. The backing layer assembly includes a first thermally conductive mesh disposed in a matrix enclosure. The first thermally conductive mesh is positioned to conduct thermal energy away from the piezoelectric layer. In one aspect, the first thermally conductive mesh is a grid of elongated strands of a metal or metal alloy material oriented in at least one of transverse or oblique directions.

18 Claims, 4 Drawing Sheets

ULTRASOUND TRANSDUCER ELEMENT AND METHOD FOR PROVIDING AN ULTRASOUND TRANSDUCER ELEMENT

BACKGROUND OF THE INVENTION

The subject matter described herein relates to acoustic transducers, such as ultrasound transducers.

Known ultrasound transducers are designed to transmit acoustic waves toward an object to be imaged and to receive reflections of the waves off of the body as acoustic echoes. These echoes are converted into an electric signal that can be used to create an image of the body. The transducers may include piezoelectric materials that are excited by an electric charge and, as a result, generate the acoustic wave. The transducers are designed to transmit most of the energy of the acoustic wave in a forward direction, such as the front side of an ultrasound transducer probe. The piezoelectric materials also generate an electric charge or signal when the materials receive the echoes. The charge or signal then may be used to generate the image.

Some energy created by the transducers may be transmitted in an opposite direction. For example, some of the energy can be transmitted as backward directed acoustic waves. These acoustic waves can be directed into the ultrasound probe. The backward directed acoustic waves may be reflected off of the housing or other structures in the ultrasound probe. The reflection of the backward directed acoustic waves may cause specular or backscattered energy or components of the acoustic waves to be directed back into the piezoelectric materials of the transducers. The receipt of the specular or backscattered energy can create visible artifacts in the image and thereby degrade the quality of the image.

In order to reduce the reflection of the backward directed acoustic waves, some known transducers include backing layers that attenuate the acoustic waves. These backing layers tend to be poor thermal conductors, which can cause a considerable amount of thermal energy being created during use of the ultrasound transducers. This thermal energy can be trapped inside the ultrasound probe between the piezoelectric materials and the probe housing. The thermal energy can significantly heat the piezoelectric materials and other components within the probe, which can damage the internal components of the probe and/or degrade the quality of image, or be a safety issue.

BRIEF DESCRIPTION

In one embodiment, an ultrasound transducer element that is configured to be disposed in a housing is provided. The transducer element includes a piezoelectric layer, a front end body, and a backing layer assembly. The piezoelectric layer extends between opposite front and back sides and is configured to transmit acoustic waves from the front side. The front end is body disposed proximate to the front side of the piezoelectric layer and is configured to emit the acoustic waves out of the housing. The backing layer assembly is disposed proximate to the back side of the piezoelectric layer. The backing layer assembly includes a first thermally conductive mesh disposed in a matrix enclosure. The first thermally conductive mesh is positioned to conduct thermal energy away from the piezoelectric layer. In one aspect, the first thermally conductive mesh is a grid of elongated strands of a metal or metal alloy material oriented in at least one of transverse or oblique directions.

In another embodiment, another ultrasound transducer element is provided. The transducer element includes a piezoelectric layer, a front end body, and a backing layer assembly. The piezoelectric layer extends between opposite front and back sides and is configured to transmit acoustic waves from the front side. The front end body is disposed proximate to the front side of the piezoelectric layer and is configured to emit the acoustic waves away from the piezoelectric layer. The backing layer assembly is disposed proximate to the back side of the piezoelectric layer. The backing layer assembly includes a thermally conductive body disposed in a non-electrically conductive matrix enclosure. The thermally conductive body includes acoustically transmissive openings that permit at least some of backward directed components of the acoustic waves transmitted by the piezoelectric element toward the backing layer assembly to pass through the thermally conductive mesh while the thermally conductive body directs thermal energy away from the piezoelectric layer.

In another embodiment, a method for providing an ultrasound transducer element is provided. The method includes providing a thermally conductive body having a plurality of openings extending therethrough and molding a polymer matrix around at least a portion of the thermally conductive body. The method also includes loading the polymer matrix and the thermally conductive body into a housing that holds a piezoelectric layer. The thermally conductive body is disposed within the housing to conduct thermal energy away from the piezoelectric layer while permitting acoustic waves to pass through the openings in the thermally conductive body without axially reflecting the acoustic waves. In one aspect, the method includes weaving a plurality of elongated electrically conductive strands into a mesh to form the thermally conductive body.

BRIEF DESCRIPTION OF THE DRAWINGS

The presently disclosed subject matter will be better understood from reading the following description of non-limiting embodiments, with reference to the attached drawings, wherein below.

DETAILED DESCRIPTION

As used herein, an element or step recited in the singular and proceeded with the word “a” or “an” should be understood as not excluding plural of said elements or steps, unless such exclusion is explicitly stated. Furthermore, references to “one embodiment” of the invention do not exclude the existence of additional embodiments that also incorporate the recited features. Unless explicitly stated to the contrary, embodiments “comprising,” “including,” or “having” an element or a plurality of elements having a particular property may include additional such elements not having that property.

The subject matter described herein relates to transducer elements, such as ultrasound transducer elements that may be combined in an array to transmit acoustic ultrasound waves and receive acoustic ultrasound echoes in order to image an object. Alternatively, the transducer elements may be used for non-imaging purposes. In one embodiment, the transducer elements have backing layer assemblies that include a thermally and/or electrically conductive mesh encased in an acoustically transmissive matrix material. The mesh thermally conducts heat generated in the transducer element away from the transducer element while permitting backward directed components of acoustic waves generated by the transducer element to at least partially pass through the mesh. For example, the backward directed components of the acoustic waves can at least partially pass through openings in the mesh without being reflected back into the transducer element.

Figure 1:
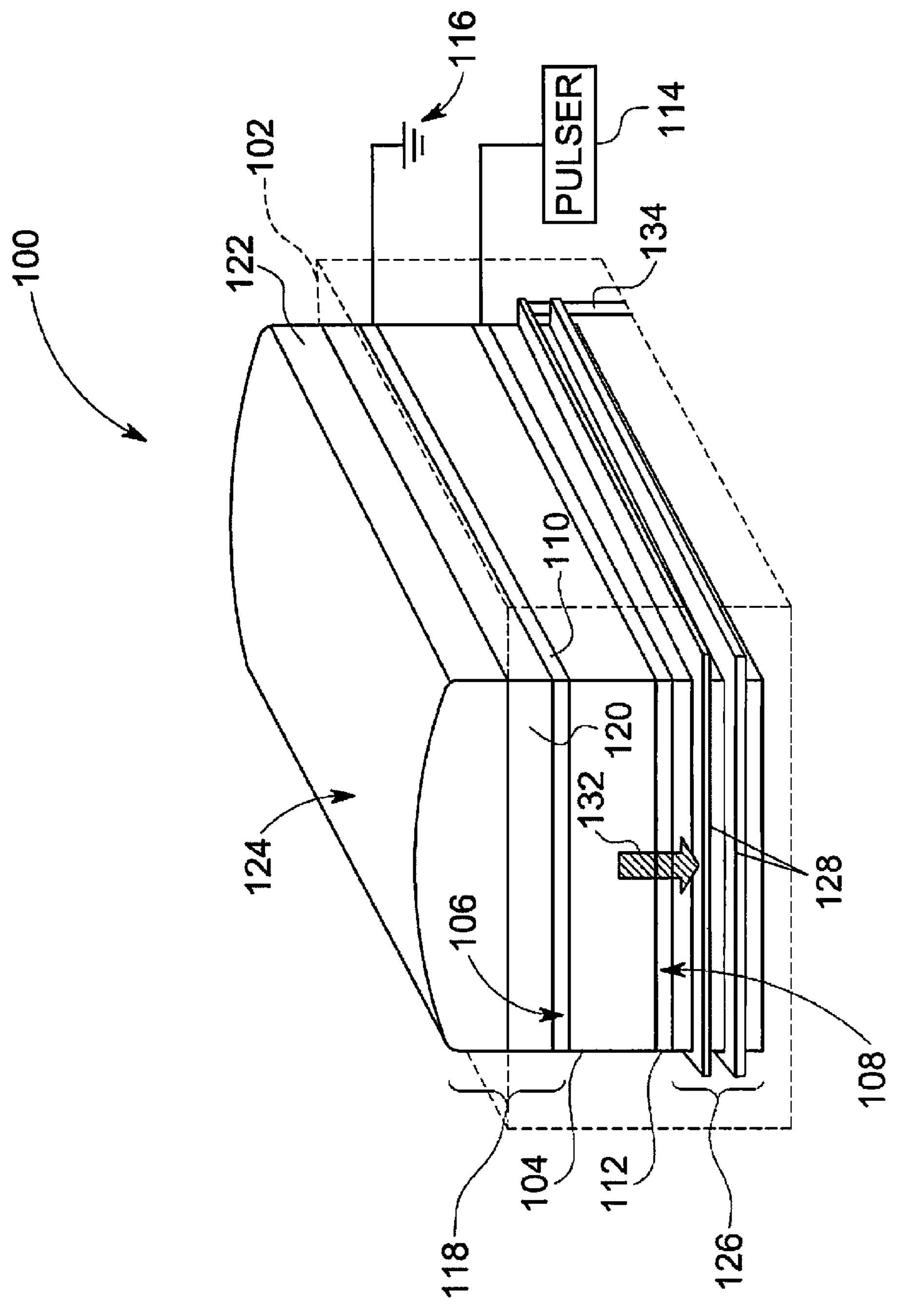
FIG. 1 is a perspective view of one embodiment of a transducer element.

FIG. 1 is a perspective view of one embodiment of a transducer element 100. The transducer element 100 may be combined with a plurality of other transducer elements 100 in an array. Each of the transducer elements 100 generates acoustic waves that are directed toward a target, such as a body to be imaged. One or more of the acoustic waves are reflected off the target back toward the transducer elements 100 as acoustic echoes. The transducer elements 100 receive the acoustic echoes and generate electric signals that represent the magnitude of the acoustic echoes. These signals may be used to create an image of the target.

The transducer element 100 includes a housing 102 that provides structural support for the transducer element 100. Only a portion of the housing 102 is shown in phantom form in FIG. 1. The housing 102 may be sufficiently large to hold several transducer elements 100 near each other to form an array. The housing 102 may be formed from a rigid or semi-rigid material, such as a polymer. The housing 102 can be provided in a variety of shapes, such as in a handheld ultrasound probe, an esophageal probe, a catheter, and the like.

A piezoelectric layer 104 is disposed in the housing 102. The piezoelectric layer 104 is a body that includes or is formed from a piezoelectric material, or a material that generates an electric charge in response to an applied mechanical force and that generates a mechanical force in response to an applied electric charge. The piezoelectric material may be, for example, lead zirconate titanate (PZT). Alternatively, other piezoelectric materials may be used. While the illustrated transducer element 100 includes only a single piezoelectric layer 104, alternatively a plurality of piezoelectric layers 104 may be provided. For example, the transducer element 100 may include two or more piezoelectric layers 104 stacked on each other.

The piezoelectric layer 104 extends between opposite front and back sides 106, 108. A front end body 118 of the transducer element 100 is disposed at or near the front side 106. The front end body 118 includes a ground electrode 110 that is coupled to the front side 106 of the piezoelectric layer 104. A signal electrode 112 is coupled to the back side 108 of the piezoelectric layer 104. The electrodes 110, 112 are electrically conductive bodies, such as layers that include or are formed from one or more metals or metal alloys. The electrodes 110, 112 may be provided as layers that extend over all or substantially all of the footprint of the piezoelectric layer 104, or may be provided as another shape and/or extend over less than all of the footprint of the piezoelectric layer 104. The term "footprint" means the area encompassed by the front or back side 106, 108 of the piezoelectric layer 104.

The signal electrode 112 is conductively coupled with pulser electronics 114 ("pulser") by one or more busses, wires, cables, and the like. The pulser electronics 114 include one or more computer processors, controllers, or other logic-based devices that control transmission and reception of electronic signals to and from the signal electrode 112. For example, the pulser electronics 114 may represent a back end of an ultrasound imaging system that controls transmission of ultrasound waves to image a body and processes the electric signals based on received ultrasound echoes to form the image of the body. In a transmission mode of the pulser electronics 114, the pulser electronics 114 transmit pulse signals to the signal electrode 112. The pulse signals are electric control signals that apply a charge to the signal electrode 112. The applied charge causes the piezoelectric layer 104 to emit acoustic waves in one or more directions. For example, the piezoelectric layer 104 may transmit acoustic waves from at least the front side 106 and the back side 108 of the piezoelectric layer 104. When the piezoelectric layer 104 receives an acoustic echo, the received acoustic echo may cause mechanical strain in the piezoelectric layer 104, which creates an electric charge in the piezoelectric layer 104. The electric charge is conducted to the signal electrode 112, which conveys the electric charge to the pulser electronics 114. The pulser electronics 114 uses the electric charges received from several transducer elements 100 to form an image.

The ground electrode 110 is conductively coupled with an electric ground reference 116 by one or more busses, wires, cables, and the like. The ground electrode 110 conveys at least some electric charge generated by the piezoelectric layer 104 to the ground reference 116 to avoid interference or crosstalk with the electric charge conveyed to the signal electrode 112.

The front end body 118 also may include one or more matching layers 120 and a lens 122. In the illustrated embodiment, the lens 122 is a body having a transmission surface 124 through which the acoustic waves generated by the piezoelectric layer 104 are emitted. The lens 122 may be formed from a material having a relatively low acoustic impedance characteristic relative to the piezoelectric layer 104. An acoustic impedance characteristic represents the resistance of a material to the passage of an acoustic wave through the material. The lens 122 may be formed from silicone rubber. Alternatively, the lens 122 may be formed from another material. Although the transmission surface 124 is a convex surface in the illustrated embodiment, the transmission surface 124 may be flat, concave, or have another shape in another embodiment.

The matching layers 120 are disposed between the lens 122 and the piezoelectric layer 104 and have acoustic impedance characteristics between the acoustic impedance characteristics of the piezoelectric layer 104 and the lens 122. For example, the lens 122 may have a relatively low acoustic impedance characteristic while the piezoelectric layer 104 has a relatively large acoustic impedance characteristic. The matching layers 120 may have one or more acoustic impedance characteristics that are greater than the acoustic impedance characteristic of the lens 122 and less than the acoustic impedance characteristic of the piezoelectric layer 104. The intermediate acoustic impedance characteristic(s) of the matching layers 120 can reduce the difference between the acoustic impedance characteristics of the lens 122 and the piezoelectric layer 104. For example, without the matching layers 120, piezoelectric layer 104 may abut the lens 122 and create an interface between the piezoelectric layer 104 and the lens 122. The difference in acoustic impedance characteristics at this interface can be referred to as a mismatch. A relatively large mismatch or difference between the acoustic impedance characteristics of the piezoelectric layer 104 and the lens 122 may cause a significant amount of the energy of the acoustic waves transmitted by the piezoelectric layer 104 to be reflected away from the lens 122 back toward the piezoelectric layer 104. The matching layers 120 can provide a transition region where the mismatch is gradually reduced in order to decrease the reflected acoustic waves.

A backing layer assembly 126 is disposed in the housing 102 at or near the back side 108 of the piezoelectric layer 104. For example, the backing layer assembly 126 may be separated from the back side 108 by the signal electrode 112. Alternatively, the backing layer assembly 126 may at least partially abut the back side 108 of the piezoelectric layer 104. The backing layer assembly 126 includes a thermally conductive body 128 held within a matrix enclosure 130. The thermally conductive body 128 includes, or is formed from, one or more materials that conduct thermal energy or heat more than the matrix enclosure 130. For example, the thermally conductive body 128 may have a larger thermal conductivity characteristic than other components of the transducer element 100, such as the piezoelectric layer 104, the matrix enclosure 130, the matching layers 120, and/or the lens 122.

In one embodiment, the thermally conductive body 128 is formed from a metal or metal alloy. For example, the thermally conductive body 128 may include, or be formed from, aluminum, alumina, copper, or another thermally and/or electrically conductive material. As described below, the thermally conductive body 128 may be formed as a mesh or grid of thermally conductive strands, such as metal or metal alloy strands.

In one embodiment, the backing layer assembly 126 may include one or more additional de-matching layers (not shown) disposed between the piezoelectric layer 104 and the thermally conductive body 128. The de-matching layers can abut the back side 108 of the piezoelectric layer 104. The de-matching layers may be relatively thin layers (e.g., less than one wavelength of the acoustic pulses generated by the piezoelectric layer 104). The de-matching layers can have relatively high acoustic impedance characteristics such that the de-matching layers absorb or otherwise reduce the amount or energy of the acoustic pulses that are directed out of the piezoelectric layer 104 toward the thermally conductive body 128. Reducing the acoustic pulses that reach the thermally conductive body 128 can reduce the amount of acoustic pulses that are reflected off of the thermally conductive body 128.

The illustrated embodiment shows the single transducer element 100 including a single backing layer assembly 126. Alternatively, a single backing layer assembly 126 may be provided for several transducer elements 100. For example, the backing layer assembly 126 and/or the thermally conductive body 128 of the backing layer assembly 126 may be a monolithic body that extends through several transducer elements 100. The backing layer assembly 126 and/or thermally conductive body 128 may extend below several transducer elements 100 disposed side-by-side in an array of an ultrasound imaging probe.

The matrix enclosure 130 may include, or be formed from, a dielectric or non-electrically conductive material, such as a polymer. By way of example only, the matrix enclosure 130 may be formed from silicone. The thermally conductive body 128 may be at least partially molded into the matrix enclosure 130. For example, the matrix enclosure 130 may be molded onto and/or through the mesh of the thermally conductive body 128. Alternatively, the matrix enclosure 130 may be separately formed from the thermally conductive body 128 and then laminated to the thermally conductive body 128.

The thermally conductive body 128 conducts thermal energy away from the piezoelectric layer 104 and other components in the housing 102 (such as other electronic components in a probe head that includes the transducer element 100 and is manipulated by an operator to image a body). The thermally conductive body 128 may be oriented approximately parallel to the back side 108 of the piezoelectric layer 104. Thermal energy can be generated within the transducer element 100, such as when the piezoelectric layer 104 is energized and/or generates an electric charge. At least some of the thermal energy may pass through the transducer element 100 toward the backing layer assembly 126 along a backward direction 132. The thermally conductive body 128 receives this thermal energy and conducts the thermal energy out of the backing layer assembly 126 in directions that are transversely or obliquely oriented with respect to the backward direction 132. For example, the thermally conductive body 128 may conduct the received thermal energy in directions that extend in, or are parallel to, the plane defined by the thermally conductive body 128. Conducting the heat out of the backing layer assembly 126 can reduce the amount of heat that remains inside the transducer element 100 and/or reaches other components held in the same housing 102 as the transducer element 100.

In one embodiment, the housing 102 includes a thermally conductive pathway 134 that is conductively joined to the thermally conductive body 128. The thermally conductive pathway 134 receives thermal energy from the thermally conductive body 128 and conducts the thermal energy out of the housing 102. For example, the thermally conductive pathway 134 may be one or more conductive vias or bodies that are joined with an external heat sink disposed outside of the housing 102, such as a ribbed metallic body. The thermally conductive body 128 and the thermally conductive pathway 134 can transfer thermal energy inside the housing 102 and the transducer element 100 to the heat sink in order to remove the thermal energy from the housing 102 and the transducer element 100. The thermal energy may be dissipated to the atmosphere by the heat sink.

In the illustrated embodiment, the backing layer assembly 126 includes a single thermally conductive body 128. Alternatively, the backing layer assembly 126 may include multiple thermally conductive bodies 128. For example, the backing layer assembly 126 may include additional thermally conductive bodies 128 oriented parallel to each other and to the back side 108 of the piezoelectric layer 104. Increasing the number of thermally conductive bodies 128 can increase the amount of thermal energy that is transferred out of the transducer element 100 and/or the rate at which the thermal energy is expelled from the transducer element 100.

As shown in FIG. 1, the thermally conductive body 128 is spaced apart from the ground and signal electrodes 110, 112. The thermally conductive body 128 is separated from the ground electrode 110 by the matrix enclosure 130, the signal electrode 112, and the piezoelectric layer 104. The thermally conductive body 128 is separated from the signal electrode 112 by the matrix enclosure 130. Spacing the thermally conductive body 128 apart from the ground and signal electrodes 110, 112 by one or more non-conductive, insulating, or dielectric materials can prevent the thermally conductive body 128 from being conductively coupled to the ground and/or signal electrodes 110, 112 so as to avoid shorting out or shunting the ground and/or signal electrodes 110, 112.

Figure 2:
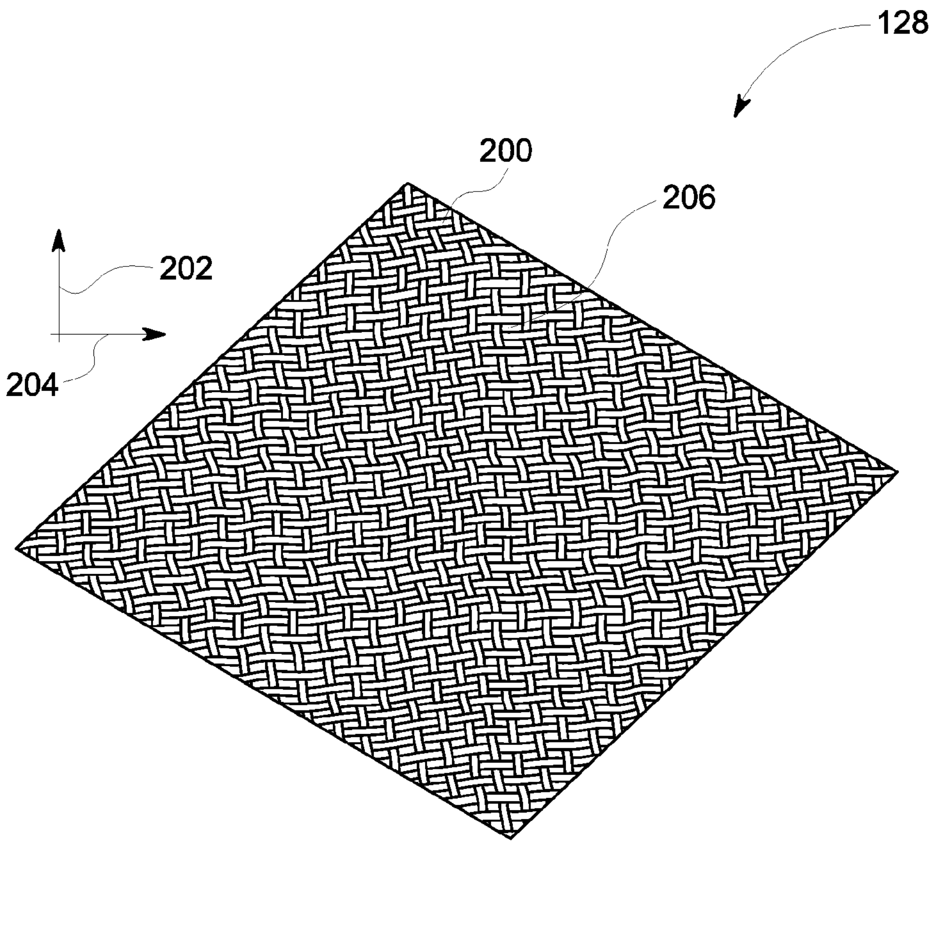
FIG. 2 is a top view of one embodiment of a thermally conductive body disposed in a backing layer assembly shown in FIG. 1.

FIG. 2 is a top view of one embodiment of the thermally conductive body 128 disposed in the backing layer assembly 126. The illustrated thermally conductive body 128 includes several interwoven or overlapping strands 200 that form a grid or mesh. The strands 200 may include, or be formed from, elongated bodies of thermally and/or electrically conductive materials. The mesh of the thermally conductive body 128 is formed by orienting the strands 200 in oblique or transverse directions with respect to each other. For example, the thermally conductive body 128 may be formed by orienting a first set or group of the strands 200 along a first direction 202 and overlapping or weaving the strands 200 of a second set or group along a non-parallel second direction 204. In the illustrated embodiment, the first and second directions 202, 204 are perpendicular. Alternatively, the first and second directions 202, 204 may be obliquely oriented with respect to each other.

Weaving the strands 200 to form the mesh shown in FIG. 2 also may create openings 206 extending through the thermally conductive body 128. For example, the strands 200 in the first group that are oriented along the first direction 202 may be spaced apart from each other along the second direction 204. Similarly, the strands 200 in the second group that are oriented along the second direction 204 may be spaced apart from each other along the first direction 202. Spacing the strands 200 apart from each other provides the openings 206 through the thermally conductive body 128.

In one embodiment, the openings 206 are acoustically transmissive openings that provide passageways through the thermally conductive body 128 for acoustic waves to pass. With respect to the position of the thermally conductive body 128 shown in FIG. 1, backward directed components of acoustic waves generated by the piezoelectric layer 104 (e.g., waves that are transmitted along the backward direction 132) may propagate through the matrix enclosure 130 of the backing layer assembly 126 and reach the thermally conductive body 128. At least some of the backward directed acoustic waves may strike the strands 200 of the thermally conductive body 128 and be reflected back toward the piezoelectric layer 104 (referred to herein as "axial reflection"). However, other components of the backward directed acoustic waves pass through the openings 206 without being reflected. These components of the acoustic waves propagate through the backing layer assembly 126 and are attenuated by the matrix enclosure 130 or other components of the transducer element 100 without being axially reflected.

The amount of backward directed components of the acoustic waves that pass through the openings 206 and are attenuated without reflection back toward the piezoelectric layer 104 can be adjusted based on the size of the openings 206. For example, as the size of the openings 206 increases, more of the backward directed components of the acoustic waves pass through the thermally conductive body 128 without being reflected. In order to increase the size of the openings 206, the strands 200 can be positioned farther from each other. Conversely, as the size of the openings 206 decreases, less of the backward directed components of the acoustic waves may pass through the thermally conductive body 128 without being reflected. However, the smaller size of the openings 206 may be a result of the strands 200 being closer together, the strands 200 being larger, and/or more strands 200 being included in the thermally conductive body 128. Moving the strands 200 closer together, providing larger strands 200, and/or providing more strands 200 may increase the thermal conductivity of the thermally conductive body 128. As a result, the thermally conductive body 128 may transfer more thermal energy out of the transducer element 100 (shown in FIG. 1) and/or transfer the thermal energy out of the transducer element 100 at a greater rate. Therefore, the size of the openings 206, the positioning of the strands 200 relative to each other, the number of strands 200 in the thermally conductive body 128, and/or the size of the strands 200 may be varied to change an efficiency at which the thermally conductive body 128 transfers thermal energy out of the transducer element and/or the amount of backward directed components of acoustic waves that are able to pass through the thermally conductive body 128 without axial reflection.

In another embodiment, the thermally conductive body 128 may be a thermally conductive solid structure of material having holes cut through the structure. For example, the thermally conductive body 128 may be a solid sheet or plane of a metal or metal alloy having several holes extending through the sheet. The metallic sheet may thermally conduct heat out of the transducer element 100 while the holes permit backward directed components of acoustic waves to pass through the sheet without being axially reflected. The holes may have circular, polygon, or other shapes.

In another embodiment, the backing layer assembly 126 may include a composite material having thermally conductive bodies interspersed therein. For example, instead of or in addition to the thermally conductive body 128, the backing layer assembly 126 may include metallic strands, segments, bodies, and the like, dispersed within the matrix enclosure 130. The metallic strands, segments, bodies, and the like may increase the thermal conductivity of the matrix enclosure 130 without significantly increasing the axial reflection of acoustic waves. The increased thermal conductivity of the matrix enclosure 130 may permit heat generated by the piezoelectric layer 104 to be conducted out of the transducer element 100.

Figure 3:
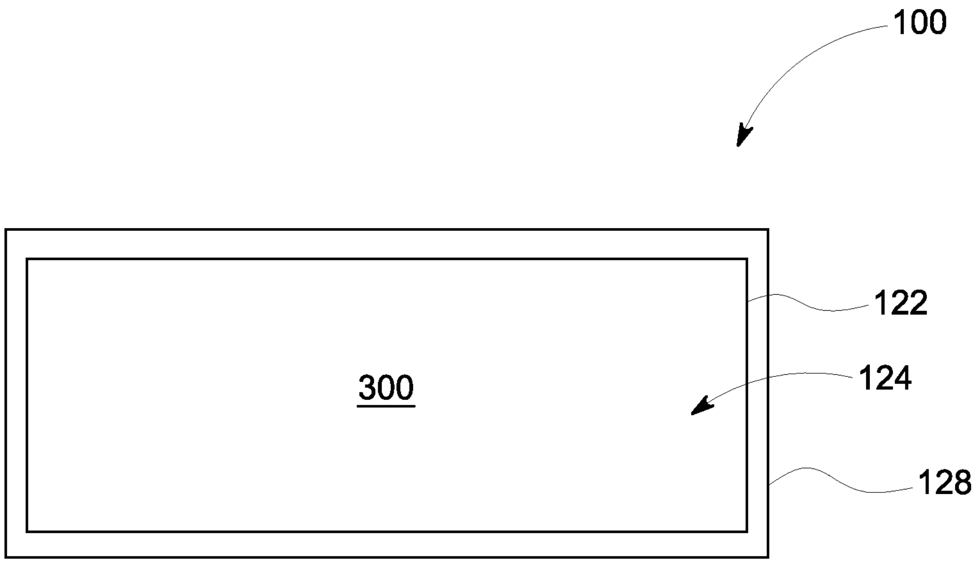
FIG. 3 is a top view of one embodiment of the transducer element shown in FIG. 1.

FIG. 3 is a top view of one embodiment of the transducer element 100. As described above, the lens 122 of the transducer element 100 provides a transmission surface 124 through which acoustic waves are transmitted and/or acoustic echoes are received. The transmission surface 124 may define an acoustically transmitting footprint 300 of the transducer element 100. Alternatively, the front side 106 (shown in FIG. 1) of the piezoelectric layer 104 (shown in FIG. 1) may define the acoustically transmitting footprint 300 of the transducer element 100. The acoustically transmitting footprint 300 represents the area over which acoustic waves are transmitted from the transducer element 100 in the plane represented by FIG. 3 or in a plane that is parallel thereto. While the acoustically transmitting footprint 300 extends over the entire lens 122 in the illustrated embodiment, alternatively the acoustically transmitting footprint 300 may extend over less than the entire lens 122.

The thermally conductive body 128 can extend over an area that is larger than the acoustically transmitting footprint 300 of the transducer element 100. For example, as shown in FIG. 3, the thermally conductive body 128 may be larger than the acoustically transmitting footprint 300 in that the thermally conductive body 128 projects outward from the sides of the transducer element 100. The thermally conductive body 128 may be larger than the acoustically transmitting footprint 300 in order to increase the thermal energy that is generated by the piezoelectric layer 104 and conducted out of the transducer element 100 by the thermally conductive body 128. For example, by making the thermally conductive body 128 at least as large as the acoustically transmitting footprint 300, the thermally conductive body 128 may be able to capture and thermally conduct heat that is generated across all or substantially all of the back side 108 (shown in FIG. 1) of the piezoelectric layer 104, as opposed to just a portion of the back side 108.

Figure 4:
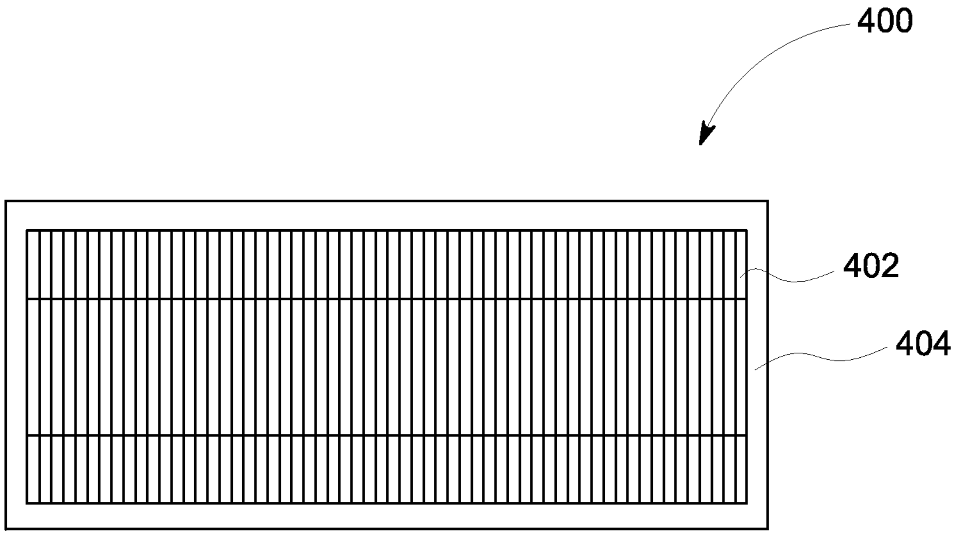
FIG. 4 is a top view of a monolithic transducer array formed in accordance with one embodiment.

FIG. 4 is a top view of a monolithic transducer array 400 formed in accordance with one embodiment. The transducer array 400 includes several transducer elements 402 regularly spaced (e.g., equal intervals) in the array 400. Each of the transducer elements 402 may be similar to the transducer element 100 (shown in FIG. 1). For example, the transducer elements 402 may each include a piezoelectric layer and ground and/or signal electrodes. In the illustrated embodiment, a monolithic thermally conductive body 404 extends below the transducer elements 402 in the array 400. The thermally conductive body 404 may be similar to the thermally conductive body 128 (shown in FIG. 1). For example, the thermally conductive body 404 may be formed from thermally conductive strands that are woven together in a mesh or grid with openings extending therethrough.

One difference between the thermally conductive body 404 and the thermally conductive body 128 (shown in FIG. 1) is that the thermally conductive body 404 extends below and conducts heat from several of the transducer elements 402. For example, the thermally conductive body 404 may continuously extend below a plurality of the transducer elements 402 such that the thermal energy directed toward the thermally conductive body 404 by the transducer elements 402 may be conducted out of the transducer elements 402 by the same thermally conductive body 404. Alternatively, the thermally conductive body 404 may be formed by joining several smaller thermally conductive bodies. For example, several of the thermally conductive bodies 128 may be conductively coupled with each other to form the monolithic thermally conductive body 404.

Figure 5:
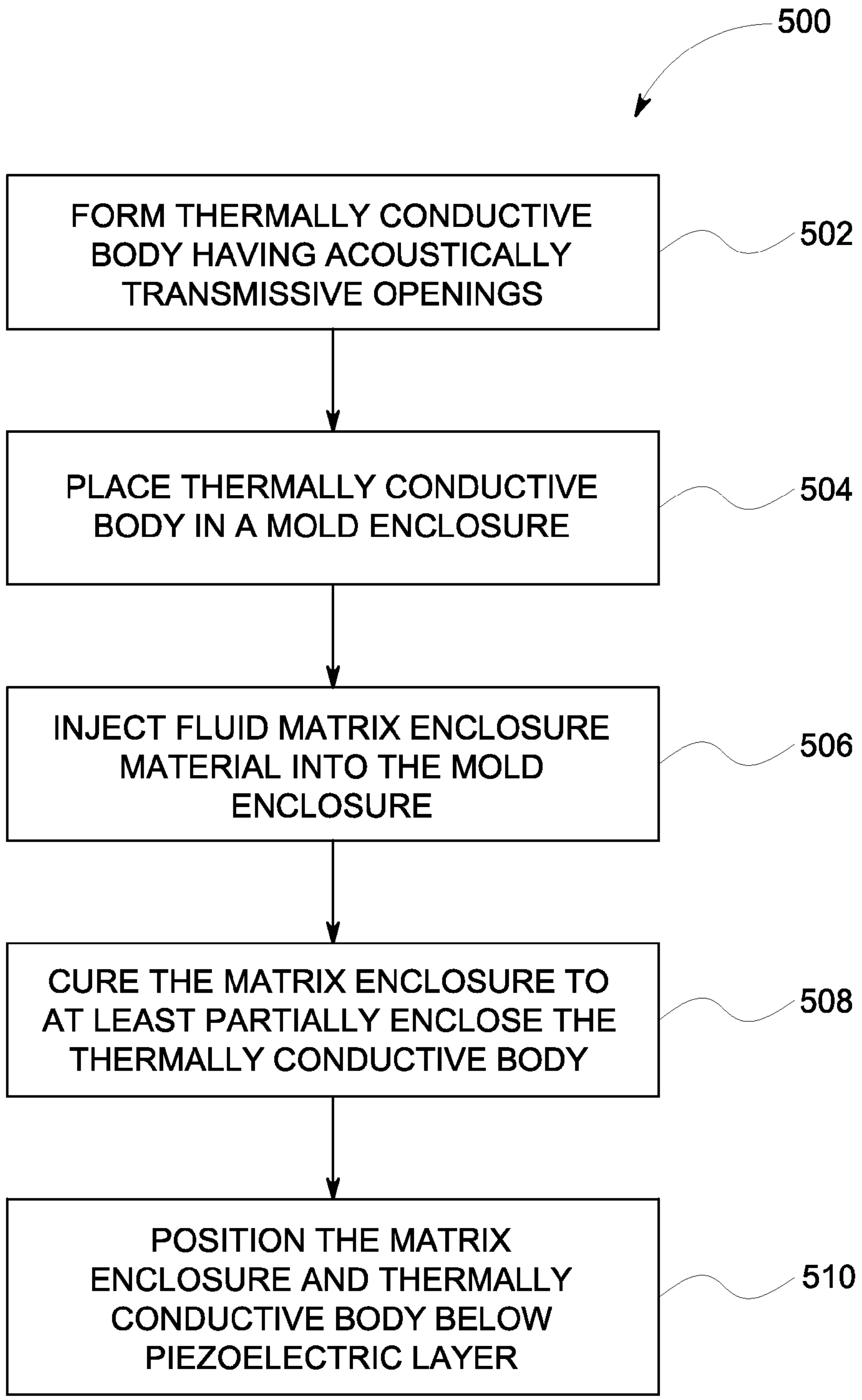
FIG. 5 is a flowchart for a method of providing a backing layer assembly of a transducer element or a transducer array in accordance with one embodiment.

FIG. 5 is a flowchart for a method 500 of providing a backing layer assembly of a transducer element or a transducer array in accordance with one embodiment. The method 500 may be used to create the backing layer assembly 126 (shown in FIG. 1). At 502, a thermally conductive body having acoustically transmissive openings is formed. For example, thermally and/or electrically conductive elongated strands may be woven together to form a mesh or grid having openings between the strands. Alternatively, a thermally and/or electrically conductive sheet having holes extending through the sheet may be provided.

At 504, the thermally conductive body is placed into a mold enclosure. For example, the thermally conductive body may be loaded into a mold that is substantially sealed, but for an inlet.

At 506, a fluid matrix enclosure material is loaded into the mold enclosure. For example, the material(s) used to form the matrix enclosure 130 (shown in FIG. 3) may be inserted into the mold enclosure through the inlet. The fluid materials can fill or substantially fill the volume inside the mold enclosure and at least partially enclose the thermally conductive body.

At 508, the matrix enclosure material is cured to at least partially enclose the thermally conductive body in the matrix enclosure material. For example, the mold enclosure with the fluid matrix enclosure material and/or the thermally conductive body may be allowed to cure at ambient temperature and/or heated to allow the matrix enclosure material to cure and solidify about the thermally conductive body.

At 510, the matrix enclosure material and thermally conductive body are placed into a transducer element as a backing layer assembly. For example, once the matrix enclosure material is cured, the matrix enclosure material and the thermally conductive body form the backing layer assembly for a transducer element or for an array of transducer elements. The matrix enclosure material and the thermally conductive body may be positioned within a housing of an ultrasound probe with piezoelectric layers or elements disposed between the backing layer assembly and a transmission face or surface of the probe.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the subject matter disclosed herein without departing from its scope. While the dimensions and types of materials described herein are intended to define the parameters of the one or more embodiments of the subject matter, they are by no means limiting and are exemplary embodiments. Many other embodiments will be apparent to one of ordinary skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the described subject matter, including the best mode, and also to enable one of ordinary skill in the art to practice the embodiments disclosed herein, including making and using any devices or systems and performing the methods. The patentable scope of the subject matter is defined by the claims, and may include other examples that occur to one of ordinary skill in the art. Such other examples are within the scope of the claims if they have structural elements that do not differ from the literal language of the claims, or if they include equivalent structural elements with insubstantial differences from the literal language of the claims.

What is claimed is:

1. An ultrasound transducer element configured to be disposed in a housing, the transducer element comprising:

a piezoelectric layer extending between opposite front and back sides, the piezoelectric layer configured to transmit acoustic waves from the front side;

a front end body disposed proximate to the front side of the piezoelectric layer, the front end body configured to emit the acoustic waves out of the housing; and a backing layer assembly disposed proximate to the back side of the piezoelectric layer, the backing layer assembly including a first thermally conductive mesh disposed in a matrix enclosure, wherein the first thermally conductive mesh is positioned to conduct thermal energy away from the piezoelectric layer, and wherein the front side of the piezoelectric layer defines an acoustically transmitting footprint from which the acoustic waves can be transmitted by the piezoelectric layer, the first thermally conductive mesh laterally extending beyond the footprint in at least one direction.

2. The ultrasound transducer element of claim 1, wherein the first thermally conductive mesh is a grid of elongated strands of a metal or metal alloy material oriented in at least one of transverse or oblique directions.

3. The ultrasound transducer element of claim 2, wherein the metal or metal alloy of the thermally conductive mesh includes at least one of aluminum, copper, or alumina.

4. The ultrasound transducer element of claim 1, wherein the first thermally conductive mesh is oriented approximately parallel to the back side of the piezoelectric layer.

5. The ultrasound transducer element of claim 1, wherein the first thermally conductive mesh includes acoustically transmissive openings that permit backward directed components of the acoustic waves that are transmitted from the piezoelectric layer toward the backing layer assembly to pass through the first thermally conductive mesh.

6. The ultrasound transducer element of claim 1, wherein the housing includes a thermally conductive body and the first thermally conductive mesh is conductively coupled with the conductive body of the housing.

7. The ultrasound transducer element of claim 1, wherein the backing layer assembly includes at least a second thermally conductive mesh disposed farther from the back side of the piezoelectric layer than the first thermally conductive mesh.

8. The ultrasound transducer element of claim 1, wherein the first thermally conductive mesh has an acoustic impedance characteristic that is larger than an acoustic impedance characteristic of the matrix enclosure.

9. The ultrasound transducer element of claim 1, wherein the matrix enclosure includes a polymer.

10. An ultrasound transducer element comprising:

a piezoelectric layer extending between opposite front and back sides, the piezoelectric layer configured to transmit acoustic waves from the front side;

a front end body disposed proximate to the front side of the piezoelectric layer, the front end body configured to emit the acoustic waves away from the piezoelectric layer; and a backing layer assembly disposed proximate to the back side of the piezoelectric layer, the backing layer assembly including a thermally conductive body disposed in a non-electrically conductive matrix enclosure, wherein the thermally conductive body includes acoustically transmissive openings that permit at least some of backward directed components of the acoustic waves transmitted by the piezoelectric element toward the backing layer assembly to pass through the thermally conductive mesh while the thermally conductive body directs thermal energy away from the piezoelectric layer, and wherein the front side of the piezoelectric layer defines an acoustically transmitting footprint from which the acoustic waves can be transmitted by the piezoelectric layer, the thermally conductive body laterally extending beyond the footprint in at least one direction.

11. The ultrasound transducer element of claim 10, wherein the thermally conductive body is a mesh formed from elongated strands of a metal or metal alloy material oriented in at least one of transverse or oblique directions.

12. The ultrasound transducer element of claim 10, wherein the thermally conductive body is oriented approximately parallel to the back side of the piezoelectric layer.

13. The ultrasound transducer element of claim 10, wherein the thermally conductive body has an acoustic impedance characteristic that is larger than an acoustic impedance characteristic of the matrix enclosure.

14. A method for providing an ultrasound transducer element, the method comprising:

providing a thermally conductive body having a plurality of openings extending therethrough;

molding a polymer matrix around at least a portion of the thermally conductive body; and loading the polymer matrix and the thermally conductive body into a housing that holds a piezoelectric layer, the thermally conductive body disposed within the housing to conduct thermal energy away from the piezoelectric layer while permitting acoustic waves to pass through the openings in the thermally conductive body without axially reflecting the acoustic waves, wherein a front side of the piezoelectric layer defines an acoustically transmitting footprint from which the acoustic waves can be transmitted by the piezoelectric layer, the thermally conductive body laterally extending beyond the footprint in at least one direction.

15. The method of claim 14, wherein the providing includes weaving a plurality of elongated electrically conductive strands into a mesh as the thermally conductive body.

16. The method of claim 14, further comprising conductively coupling the thermally conductive body with a conductive pathway to a heat sink of the housing.

17. The method of claim 14, wherein loading the polymer matrix and the thermally conductive body includes orienting the thermally conductive body in a parallel relationship with a back side of the piezoelectric layer.

18. The method of claim 14, wherein loading the polymer matrix and the thermally conductive body includes orienting the thermally conductive body relative to the piezoelectric element such that the thermally conductive body conducts thermal energy away from the piezoelectric element in directions that are parallel to a back side of the piezoelectric element.

* * * * *